US 6,529,260 B2

(12) United States Patent  
Sogard (10) Patent No.: US 6,529,260 B2  
(45) Date of Patent: Mar. 4, 2003

(54) LIFTING SUPPORT ASSEMBLY FOR AN EXPOSURE APPARATUS

(75) Inventor: Michael R. Sogard, Menlo Park, CA (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 09/848,856

(22) Filed: May 3, 2001

(65) Prior Publication Data

US 2002/0163631 A1 Nov. 7, 2002

(51) Int. Cl.$^7$ .............................................. G03B 27/32
(52) U.S. Cl. .......................................... 355/39; 355/53
(58) Field of Search ............................. 355/74, 39, 72, 355/75, 77, 53; 250/492.2, 454.11

(56) References Cited

U.S. PATENT DOCUMENTS

| 3,060,796 A | * | 10/1962 | Muse ........................ 315/206 |
| 4,293,770 A | * | 10/1981 | Vavrek ................... 250/454.11 |
| 4,425,508 A | | 1/1984 | Lewis, Jr. et al. |
| 4,952,858 A | | 8/1990 | Galburt |
| 5,097,138 A | | 3/1992 | Wakabayashi et al. |
| 5,214,290 A | | 5/1993 | Sakai |
| 5,247,330 A | * | 9/1993 | Ohyama et al. ............ 348/373 |
| 5,508,518 A | | 4/1996 | Kendall |
| 5,545,902 A | | 8/1996 | Pfeiffer et al. |
| 5,780,943 A | * | 7/1998 | Ono ........................... 248/638 |

FOREIGN PATENT DOCUMENTS

JP         2546365         5/1997

* cited by examiner

Primary Examiner—Russell Adams  
Assistant Examiner—D. Ben Esplin  
(74) Attorney, Agent, or Firm—Steven G. Roeder; Tina Rose

(57) ABSTRACT

A support assembly (12) for an exposure apparatus (10) includes a frame assembly (34), an elevator assembly (36) and a pivot assembly (38) for supporting at least one subassembly above an isolation base (32). The elevator assembly (36) selectively lifts the frame assembly (34) and the subassembly relative to the isolation base (32). Further, the pivot assembly (38) allows a portion of the frame assembly (34) and the subassembly to be rotated relative to the isolation base (32). As a result of this design, the subassemblies of the exposure apparatus (10) can be removed relatively easily for service and adjustment.

100 Claims, 5 Drawing Sheets

LIFTING SUPPORT ASSEMBLY FOR AN EXPOSURE APPARATUS

FIELD OF THE INVENTION

The present invention is directed to exposure apparatuses. More specifically, the present invention is directed to a support assembly for an exposure apparatus and a method for making a support assembly for an exposure apparatus that facilitates the disassembly of the major subassemblies of the exposure apparatus to allow for field servicing of the subassemblies.

BACKGROUND

Exposure apparatuses are commonly used to transfer images from a reticle onto a semiconductor wafer during semiconductor processing. A typical exposure apparatus includes a support assembly, a measurement subassembly, a control system, an illumination source having an illumination optical assembly, a projection optical subassembly, a reticle stage for retaining a reticle, and a wafer stage for retaining a semiconductor wafer.

The support assembly typically supports the measurement subassembly, the illumination optical subassembly, the projection optical subassembly, the reticle stage, and the wafer stage above the ground. The measurement subassembly monitors the positions of the stages. The wafer stage includes one or more motors to precisely position the wafer relative to the projection optical subassembly. Similarly, the reticle stage includes one or more motors to precisely position the reticle relative to the projection optical subassembly.

The feature sizes of the images transferred onto the wafer from the reticle are extremely small. Accordingly, the precise relative positioning of the wafer and the reticle is critical to the manufacture of high density, semiconductor wafers.

Unfortunately, mechanical vibrations and deformations can influence the accuracy of the exposure apparatus. For example, motors utilized in the reticle stage and the wafer stage generate reaction forces that vibrate the support assembly of the exposure apparatus. The vibrations in the support assembly can move the stages and the projection optical assembly out of precise relative alignment. Further, the vibrations in the support assembly can cause the measurement subassembly to improperly measure the relative positions of the stages. As a result thereof, the accuracy of the exposure apparatus and the quality of the integrated circuits formed on the wafer can be compromised.

Additionally, many of the subassemblies of the exposure apparatus require adjustment, modification and routine servicing that are preferably performed at the field site of the exposure apparatus. For example, the projection optical subassembly of an electron beam exposure apparatus may require the replacing of apertures and beam tubes which become contaminated by residues evaporated by the electron beam or other sources of hydrocarbons.

Unfortunately, many of these subassemblies are difficult to access and remove from the exposure apparatus. One attempt to solve this problem involves the use of an overhead crane to sequentially remove the subassemblies from the exposure apparatus. With this design, if a lower subassembly of the exposure apparatus needs to be removed, all of the upper subassemblies of the exposure apparatus must be removed before the crane can obtain access to the lower subassembly. Further, the overhead crane can take up a lot of space and can require a significant amount of clearance above the exposure apparatus. Exposure systems are normally installed in cleanrooms which have limited height. Moreover, during disassembly the operation of the overhead crane can create dust and other contaminants that can fall downward into the components of the exposure apparatus. The contaminants can influence the accuracy and performance of the components and the exposure apparatus.

In light of the above, there is a need for an improved support assembly for an exposure apparatus that provides a high degree of isolation from environmental disturbances to the projection optical subassembly and the measurement subassembly. Additionally there is a need for a support assembly that facilitates the easy access and/or removal of one or more of subassemblies of the exposure apparatus for field servicing. Further, there is a need for an exposure apparatus that can be disassembled without an overhead crane. Furthermore, there is a need for an exposure apparatus capable of manufacturing precision devices, such as high density, semiconductor wafers.

SUMMARY

The present invention is directed to a support assembly for an exposure apparatus and an exposure apparatus that satisfies these needs. The exposure apparatus includes one or more subassemblies. The support assembly includes a frame assembly and an elevator assembly. The support assembly supports the one or more subassemblies above an isolation base. Uniquely, the elevator assembly lifts at least one of the subassemblies and a portion of the frame assembly relative to the isolation base. As a result of this design, the subassembly can be easily accessed or removed from the exposure apparatus without the use of an overhead crane for service, maintenance, and adjustment.

As provided herein, the exposure apparatus includes a support assembly, an illumination system, a projection optical subassembly, a measurement subassembly, and a stage mover assembly. In one embodiment, the support assembly includes a first frame that retains the illumination optical subassembly, a second frame that retains the projection optical subassembly and the measurement subassembly, a reaction frame that retains part of the stage mover assembly, and the elevator assembly. In this embodiment, the elevator assembly (i) selectively lifts the first frame and the illumination optical subassembly relative to the second frame and the isolation base, (ii) selectively lifts the second frame and the projection optical subassembly relative to the first frame and the isolation base, and (iii) selectively lifts part of the stage mover assembly relative to the first and second frames and the isolation base.

Additionally, the support assembly can include a first pivot and a second pivot. The first pivot allows a portion of the first frame and the illumination optical subassembly to pivot relative to the second frame and the isolation base. Similarly, the second pivot allows a portion of the second frame and the projection optical subassembly to pivot relative to the first frame and the isolation base.

In summary, the elevator assembly selectively lifts and moves the optical subassemblies and the frames relative to the isolation base. The elevator assembly also selectively lifts and moves part of the stage mover assembly relative to the isolation base. Further, the pivot assembly can be used to move and pivot the optical subassemblies and a portion of the frames relative to the isolation base. As a result of this design, both optical subassemblies can be removed relatively easily from the exposure apparatus. Further, with this design, the projection optical subassembly and the measurement subassembly are supported independently from the illumination optical subassembly. This is important because the isolation requirements of the projection optical subassembly and the measurement subassembly are typically greater than the isolation requirements of the illumination optical subassembly.

The present invention is also directed to an exposure apparatus, a device, a wafer, method for making a support assembly, a method for making an exposure apparatus, a method for making a device, and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
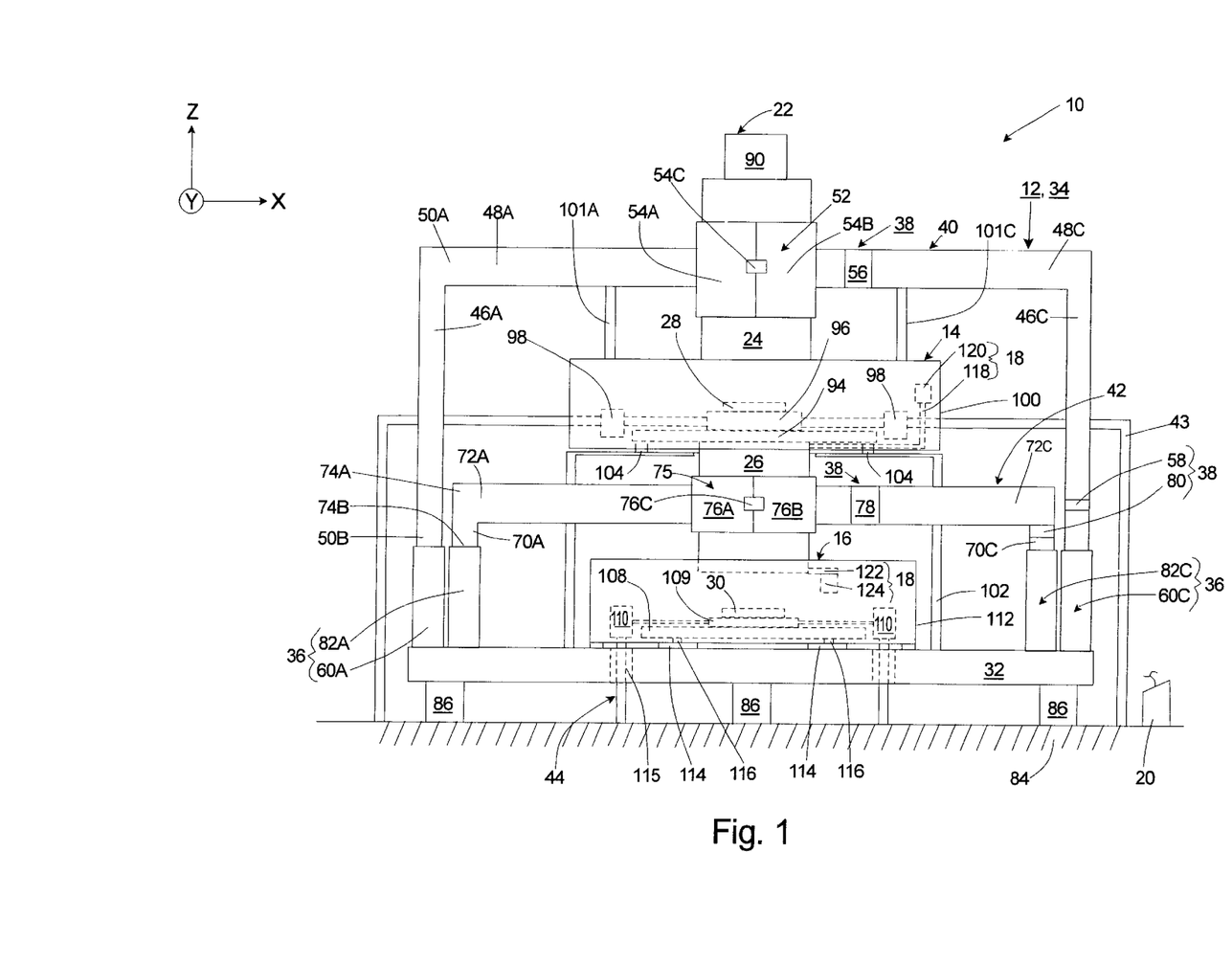
FIG. 1 is a front plan illustration of an exposure apparatus having features of the present invention.

FIG. 1 is a simplified illustration of an exposure apparatus 10 including a support assembly 12 having features of the present invention. In addition to the support assembly 12, the exposure apparatus 10 includes (i) a first stage subassembly 14 (partly illustrated in phantom in FIG. 1), (ii) a second stage subassembly 16 (partly illustrated in phantom in FIG. 1), (iii) a measurement subassembly 18 (illustrated in phantom in FIG. 1), (iv) a control system 20, (v) an illumination system 22 (irradiation apparatus) having an illumination optical subassembly 24, and (vi) a projection optical subassembly 26.

The exposure apparatus 10 is particularly useful as a lithographic tool that transfers a pattern (not shown) of an integrated circuit from a reticle 28 (illustrated in phantom in FIG. 1) onto a substrate 30 (illustrated in phantom in FIG. 1) such as a semiconductor wafer, which has been coated with a radiation sensitive resist.

There are a number of different types of lithographic tools. For example, the exposure apparatus 10 can be used as a scanning type lithography system that exposes an image of the pattern from the reticle 28 on the substrate 30 with the reticle 28 and substrate 30 moving synchronously. In a scanning type lithographic device, the reticle 28 is moved perpendicular to an optical axis of the projection optical subassembly 26 by the first stage assembly 14, and the substrate 30 is moved perpendicular to the optical axis of the projection optical subassembly 26 by the second stage assembly 16. Scanning of the reticle 28 and the substrate 30 occurs while the reticle 28 and the substrate 30 are moving synchronously.

Alternately, the exposure apparatus 10 can be a step-and-repeat type lithography system that illuminates the reticle 28 and substrate 30 while the reticle 28 and the substrate 30 are stationary. In the step and repeat process, the substrate 30 is in a constant position relative to the reticle 28 and the projection optical subassembly 26 during the exposure of an individual field on the substrate 30. Subsequently, between consecutive exposure steps, the substrate 30 is consecutively moved by the second stage subassembly 16 perpendicular to the optical axis of the projection optical subassembly 26 so that the next field of the substrate 30 is brought into position relative to the projection optical subassembly 26 and the reticle 28 for exposure. Following this process, the patterns on the reticle 28 are sequentially exposed onto the fields of the substrate 30.

The present invention is likely to be most useful when the irradiation consists of charged particles, such as electrons or ions. However, the present invention can also be useful in lithography systems where the irradiation consists of photons of any wavelength.

Further, the use of the exposure apparatus 10 provided herein is not limited to a lithography system for semiconductor manufacturing. The exposure apparatus 10, for example, can be used as a liquid crystal display (LCD) photolithography system that exposes a liquid crystal display device pattern onto a rectangular glass plate; or it can be a photolithography system for manufacturing a magnetic thin film head.

Some of the Figures provided herein include a coordinate system that designates an X axis, a Y axis, and a Z axis. It should be understood that the coordinate system is merely for reference and can be varied. For example, the X axis can be switched with the Y axis and/or the exposure apparatus 10 can be rotated.

The support assembly 12 illustrated in the Figures supports some of the subassemblies of the exposure apparatus 10 above an isolation base 32. The design of the support assembly 12 can be varied to suit the design requirements for the rest of the exposure apparatus 10. As provided herein, the support assembly 12 includes a frame assembly 34, an elevator assembly 36 and a pivot assembly 38. Uniquely, the elevator assembly 36 can be used to selectively lift and move the optical subassemblies 24, 26 and some or all of the frame assembly 34 relative to the isolation base 32. Additionally the elevator assembly 36 can be used to selectively lift and move part of the first stage subassembly 14 relative to the isolation base 32. Further, the pivot assembly 38 can be used to move and pivot the optical subassemblies 24, 26 and some of the frame assembly 34 relative to the isolation base 32. As a result of this design, both optical subassemblies 24, 26 can be removed relatively easily from the exposure apparatus 10.

The frame assembly 34 is rigid and includes a first frame 40, a second frame 42, a first reaction frame 43, and a second reaction frame 44. The design of the frames 40, 42, 43, 44 and the subassemblies supported by each of the frames 40, 42, 43, 44 can be varied to suit the design requirements of the exposure apparatus 10. In the design illustrated in the FIG. 1, (i) the first frame 40 supports the illumination system 22, including the illumination optical subassembly 24; (ii) the second frame 42 supports the projection optical subassembly 26 and the measurement subassembly 18; (iii) the first reaction frame 43 supports part of the first stage mover assembly 98 of the first stage subassembly 14 and absorbs reaction forces generated during the first stage motion; and (iv) the second reaction frame 44 supports part of the second stage mover assembly 110 of the second stage subassembly 16 and absorbs reaction forces generated during the second stage motion. In addition to the above, the frame assembly 34 includes a first base frame 102 and a second base frame 114. The first base frame 102 supports a portion of the first stage subassembly 14 which does not generate reaction forces during the first stage motion. The second base frame 114 supports a portion of the second stage subassembly 16 which does not generate reaction forces during the second stage motion.

With this design, the projection optical subassembly 26 and the measurement subassembly 18 are supported independently from the illumination optical subassembly 24. This is important because the isolation requirements of the projection optical subassembly 26 and the measurement subassembly 18 are typically greater than the isolation requirements of the illumination optical subassembly 24. Further, with this design, the first frame 40 and the illumination optical subassembly 24 can be moved relative to the second frame 36, the second stage subassembly 16, and the projection optical subassembly 26 with the elevator assembly 36. Moreover, part of the first stage subassembly 14 can be moved relative to the two optical subassemblies and the isolation base 32. This allows for relatively easy access and/or removal of the subassemblies for service, maintenance and adjustment of the exposure apparatus 10. Alternately, for example, the frame assembly could be designed so that the second frame supports the illumination optical subassembly 24, and the first frame supports the projection optical subassembly 26 and the measurement subassembly 18 of the exposure apparatus 10.

Alternatively, part of the first stage subassembly 14 could be supported directly on second frame 42. However, the different requirements of the first stage subassembly 14 and the projection optical subassembly 26 would have made a combined frame complicated and might have compromised the vibration isolation required by the projection optical subassembly 26. Therefore, separate frames are preferably used.

Figure 2A:
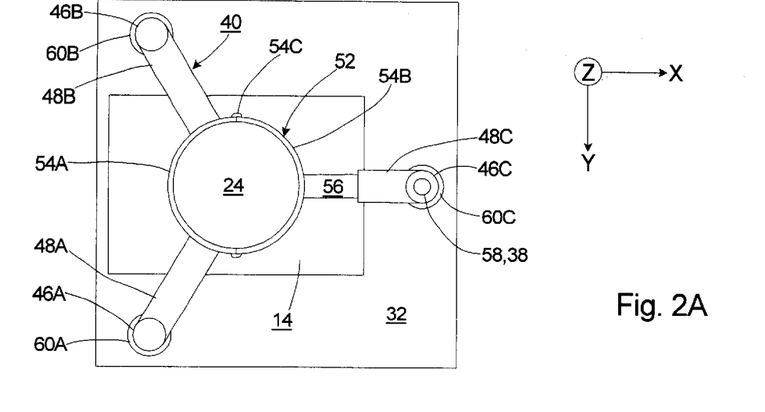
FIG. 2A is a top plan illustration of a first frame, an illumination optical subassembly, a first stage subassembly, and an isolation base having features of the present invention.
Figure 2B:
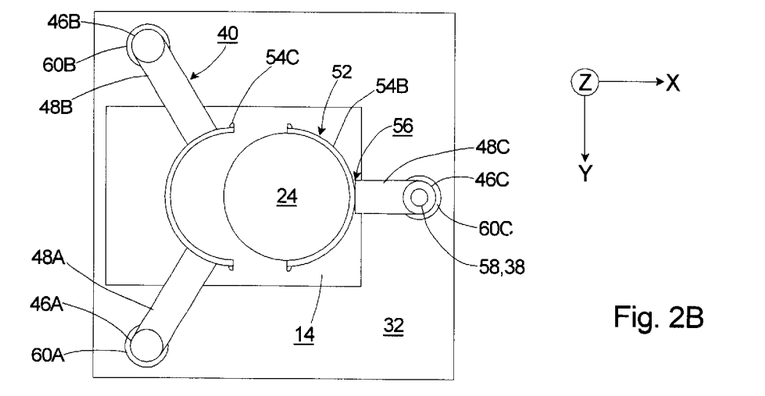
FIG. 2B is a top plan illustration of a portion of the first frame and the illumination optical subassembly retracted.
Figure 2C:
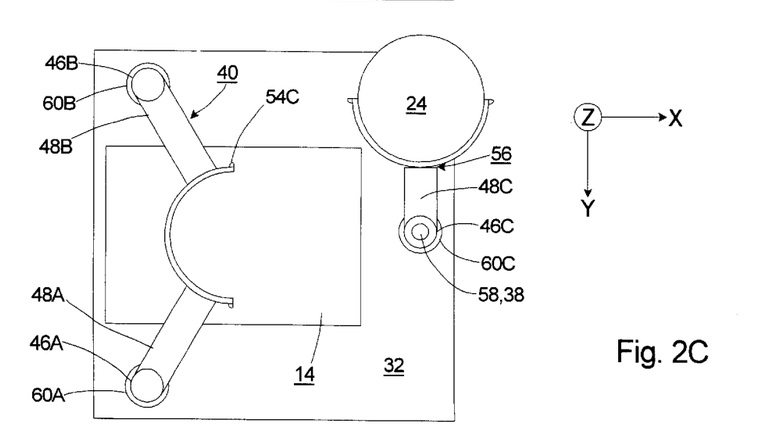
FIG. 2C is a top plan illustration of a portion of the first frame and the illumination optical subassembly rotated.

Referring to FIGS. 1, 2A–2C, the first frame 40 includes (i) a first FF ("FF" refers to the first frame) side tube 46A, (ii) a second FF side tube 46B, (iii) a third FF side tube 46C, (iv) a first FF radial tube 48A, (v) a second FF radial tube 48B, and (vi) a third FF radial tube 48C. It should be noted that FIGS. 2A–2C illustrate only the first frame 40, the illumination optical subassembly 24, the first stage subassembly 14, and the isolation base 32. The FF side tubes 46A–46C are spaced apart and each of the FF side tubes 46A–46C extends upward and substantially vertically. Each of the FF side tubes 46A–46C has an upper end 50A and an opposed lower end 50B. The first FF radial tube 48A extends radially inward from the upper end 50A of the first FF side tube 46A. Similarly, the second FF radial tube 48B extends radially inward from the upper end 50A of the second FF side tube 46B. Also, the third FF radial tube 48C extends radially inward from the upper end 50A of the third FF side tube 46C.

The shape, size and thickness of the tubes 46A–46C, 48A–48C can be varied to suit the design requirements for the support assembly 12. For example, for an exposure apparatus 10, each of the tubes 46A–46C, 48A–48C can have an annular shaped cross-section with an inner diameter of between approximately 10 and 20 inches and a wall thickness of between approximately 1 and 4 inches, although other shapes, sizes, and thickness of the tubes 46A–46C, 48A–48C can be utilized. The first frame 40 can be made of a number of materials including steel. In the embodiment illustrated in the Figures, the first frame 40 does not experience reaction forces of the first stage subassembly 14, which are borne instead by the reaction frame 43. As a result thereof, the first frame 40 can be made less stiff than if the first frame 40 experienced the reaction forces of the first stage subassembly 14.

Additionally, the first frame 40 includes a first support yoke 52 secured to the distal ends of the FF radial tubes 48A–48C. The first support yoke 52 retains the illumination optical subassembly 24 and secures the illumination optical subassembly 24 to the first frame 40. In the embodiment illustrated in the Figures, the first support yoke 52 is generally tubular shaped and includes an arc shaped first section 54A and an arc shaped second section 54B. The first section 54A is secured to the distal ends of the first and second FF radial tubes 48A and 48B. Similarly, the second section 54B is secured to the distal end of the third FF radial tube 48C.

Preferably, the first support yoke 52 also includes one or more section fasteners 54C that selectively secure the first section 54A to the second section 54B. With this design, when engaged, the section fasteners 54C allow the first section 54A and the second section 54B to function similar to a unitary structure and allow the illumination optical subassembly 24 to be supported concurrently by all three FF radial tubes 48A–48C. Further, when disengaged, the section fasteners 54C allow (i) the third FF radial tube 48C to solely support the illumination optical subassembly 24 and (ii) the second section 54B and the illumination optical subassembly 24 to be retracted away from the first section 54A.

The section fasteners 54C can be implemented in a number of ways. For example, each of section fasteners 54C can be a latch, a bolt or other type of fastener that extends between the first section 54A and the second section 54B and/or between the first section 54A and the illumination optical subassembly 24.

Preferably, the third FF radial tube 48C includes a first retractor 56 that selectively retracts the second section 54B and the illumination optical subassembly 24 away from the first section 54A and the first and second FF radial tubes 48A, 48B. More specifically, the first retractor 56 selectively moves the second section 54B and the illumination optical subassembly 24 between (i) an extended position (illustrated in FIG. 2A) in which the second section 54B and the illumination optical subassembly 24 are positioned adjacent to the first section 54A and the first and second FF radial tubes 48A, 48B, and (ii) a retracted position (illustrated in FIG. 2B) in which the second section 54B and the illumination optical subassembly 24 are positioned radially away from the first section 54A and the first and second FF radial tubes 48A, 48B. As provided below, as a result of this design, the illumination optical subassembly 24 can be easily pivoted.

The first retractor 56 can be implemented in a number of ways. For example, the first retractor 56 can include (i) a worm gear assembly that is turned manually or with a motor, (ii) a hydraulic motor, (iii) a linear electric motor, and/or (iv) a pneumatic cylinder. The amount of movement of the first retractor 56 can vary according to the design requirements of the exposure apparatus 10. Preferably, the first retractor 56 moves the illumination optical subassembly 24 linearly by at least approximately half the outer diameter of the optical subassembly 24.

Referring to FIGS. 1, 2A–2C, the pivot assembly 38 selectively pivots a portion of the first frame 40 and the illumination optical subassembly 24 relative to the isolation base 32. In the embodiment illustrated in the Figures, the pivot assembly 38 includes a first pivot 58 that allows the second section 54B, the retractor 56, the illumination optical subassembly 24, the third FF radial tube 48C and a portion of the third FF side tube 46C to be selectively pivoted and/or rotated outward away from the first section 54A. Stated another way, the first pivot 58 allows the second section 54B and the illumination optical subassembly 24 to be moved between (i) a first position (illustrated in FIG. 2B) in which the second section 54B and the illumination optical subassembly 24 are positioned radially away from the original location of the axis of the illumination optical subassembly 26 and the first section 54A and (ii) a rotated position (illustrated in FIG. 2C) in which the second section 54B and the illumination optical subassembly 24 are positioned away from the first section 54A and the first and second FF radial tubes 48A, 48B. In the rotated position, the illumination optical subassembly 24 can be easily accessed for field service and adjustment. Further, in the rotated position, the illumination optical subassembly 24 can be raised, lowered and/or positioned on a cart (not shown) using the elevator assembly 36, without the use of an overhead crane.

The first pivot 58 can be implemented in a number of ways. For example, the first pivot 58 can include (i) a roller bearing assembly and (ii) an electric motor. The amount of movement of the first pivot 58 can vary according to the design requirements of the exposure apparatus 10. Preferably, the first pivot 58 allows for the rotation of the third FF radial tube 48C at least approximately 90 degrees, and more preferably at least approximately 120 degrees, and even more preferably at least approximately 180 degrees relative to the original direction of the third FF side tube 46C.

Referring to FIGS. 1, 2A–2C, the elevator assembly 36 selectively lifts and lowers the illumination optical subassembly 24 relative to the isolation base 32 and the projection optical subassembly 26. The design of the elevator assembly 36 can be varied. In the embodiment illustrated in the Figures, the elevator assembly 36 includes a first FF elevator 60A, a second FF elevator 60B, and a third FF elevator 60C that cooperate to selectively lift the first frame 40 and the illumination optical subassembly 24 relative to the isolation base 32. In this embodiment, (i) the first FF elevator 60A is positioned between the isolation base 32 and the lower end 50B of the first FF side tube 46A and selectively lifts, lowers and/or moves the first FF side tube 46A relative to the isolation base 32, (ii) the second FF elevator 60B is positioned between the isolation base 32 and the lower end 50B of the second FF side tube 46B and selectively lifts, lowers and/or moves the second FF side tube 46B relative to the isolation base 32, and (iii) the third FF elevator 60C is positioned between the isolation base 32 and the lower end 50B of the third FF side tube 46C and selectively lifts, lowers and/or moves the third FF side tube 46C relative to the isolation base 32. Alternately, the FF elevators 60A–60C could be positioned in another location along the first frame 40.

As provided herein, the control system 20 can control the FF elevators 60A–60C to move concurrently or individually to suit the movement requirements of the first frame 40. For example, the control system 20 can control the FF elevators 60A–60C to move concurrently to lift the illumination optical subassembly 24 away from the projection optical subassembly 26. In the lifted position, the illumination optical subassembly 24 can be easily rotated and removed from the rest of the exposure apparatus 10. More specifically, after the second section 54B and the illumination optical subassembly 24 are retracted away from the first section 54A by the first retractor 56 and pivoted with the first pivot 58, the third FF elevator 60C can be controlled by the control system 20 to individually raise or lower the illumination optical subassembly 24 onto a cart without the use of an overhead crane.

Each of the FF elevators 60A–60C can be implemented in a number of ways. For example, each FF elevator 60A–60C can include (i) a worm gear assembly that is turned manually or with a motor, (ii) a hydraulic motor, (iii) a pneumatic cylinder and/or (iv) a linear electric motor. The amount of movement of each FF elevator 60A–60C can vary according to the design requirements of the exposure apparatus 10. Preferably, each FF elevator 60A–60C moves at least 3 inches, and more preferably at least approximately 6 inches, and even more preferably at least 9 inches. Each FF elevator must move enough for the bottom of the illumination optical subassembly 24 to clear the top of the first stage subassembly 14, and/or the measurement subassembly 18, and/or the first container 100 if it is present.

Figure 3A:
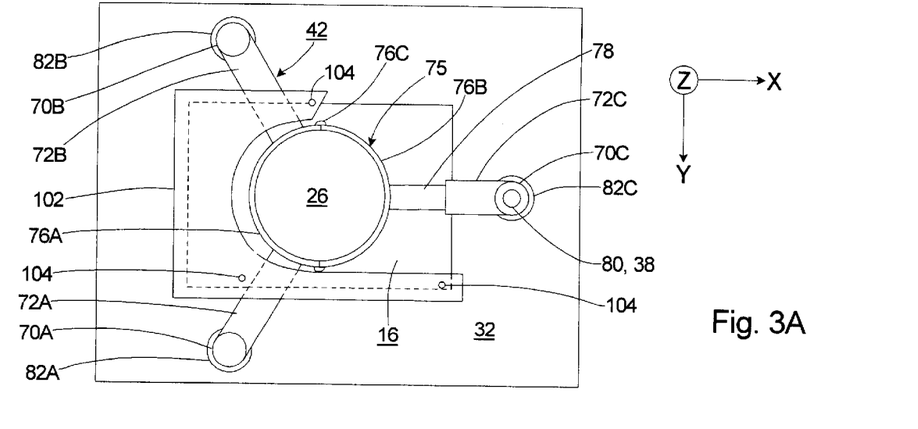
FIG. 3A is a top plan illustration of a second frame, a projection optical subassembly, a second stage subassembly, and an isolation base having features of the present invention.
Figure 3B:
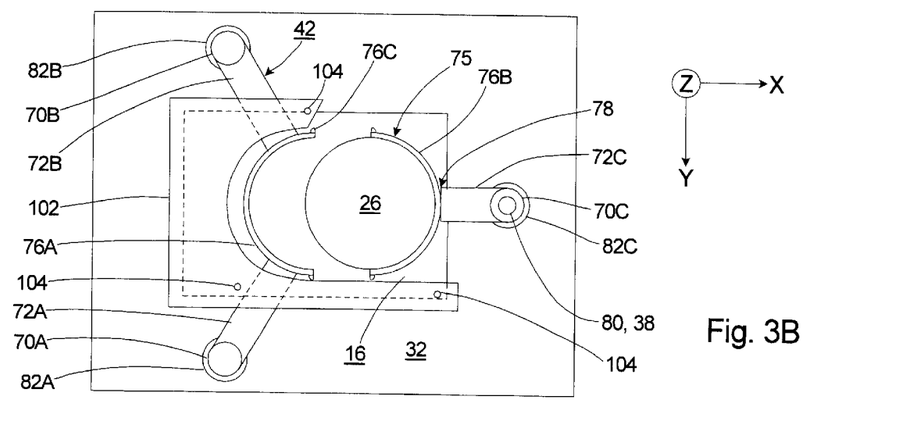
FIG. 3B is a top plan illustration with a portion of the second frame and the projection optical subassembly retracted.
Figure 3C:
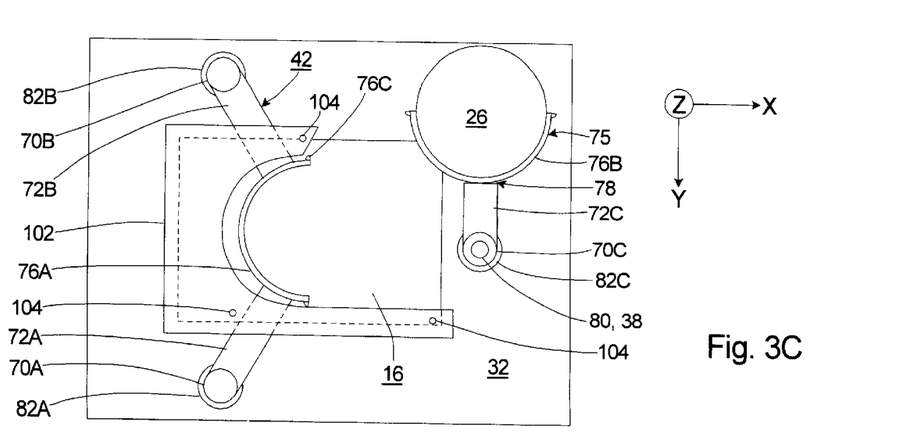
FIG. 3C is a top plan illustration with a portion of the second frame and the projection optical subassembly rotated.

Referring to FIGS. 1 and 3A–3C, the second frame 42 includes (i) a first SF ("SF" refers to the second frame) side tube 70A, (ii) a second SF side tube 70B, (iii) a third SF side tube 70C, (iv) a first SF radial tube 72A, (v) a second SF radial tube 72B, and (vi) a third SF radial tube 72C. It should be noted that FIGS. 3A–3C illustrate only the second frame 42, the projection optical subassembly 26, the second stage subassembly 16, the isolation base 32, the first base frame 102, and the first base actuators 104. The SF side tubes 70A–70C are spaced apart and each of the SF side tubes 70A–70C extends upward and substantially vertically. Each of the SF side tubes 70A–70C has an upper end 74A and an opposed lower end 74B. The first SF radial tube 72A extends radially inward from the upper end 74A of the first SF side tube 70A. Similarly, the second SF radial tube 72B extends radially inward from the upper end 74A of the second SF side tube 70B, and the third SF radial tube 72C extends radially inward from the upper end 74A of the third SF side tube 70C.

The shape, size and thickness of the tubes 70A–70C, 72A–72C can be varied to suit the design requirements for the support assembly 12. For example, for an exposure apparatus 10, each of the tubes 70A–70C, 72A–72C can have an annular shaped cross-section with an inner diameter of between approximately 10 and 20 inches and a wall thickness of between approximately 1 and 4 inches, although other shapes, sizes, and thickness of the tubes 70A–70C, 72A–72C can be utilized. The second frame 42 can be made of a number of materials including steel. In the embodiment illustrated in the Figures, the second frame 42 only supports the projection optical subassembly 26 and the measurement subassembly 18. Thus, the second frame 42 does not experience reaction forces of the second stage subassembly 16, and the tubes can be less stiff.

Additionally, the second frame 42 includes a second support yoke 75 secured to the distal ends of the SF radial tubes 72A–72C. The second support yoke 75 secures the projection optical subassembly 26 to the second frame 42. In the embodiment illustrated in the Figures, the second support yoke 75 is generally tubular shaped and includes an arc shaped first section 76A and an arc shaped second section 76B. The first section 76A is secured to the distal ends of the first and second SF radial tubes 72A and 72B. Similarly, the second section 76B is secured to the distal end of the third SF radial tube 72C.

Preferably, the second support yoke 75 also includes one or more section fasteners 76C that selectively secure the first section 76A to the second section 76B. With this design, when engaged, the section fasteners 76C allow the first section 76A and the second section 76B to function similar to a unitary structure and allow the projection optical subassembly 26 to be supported concurrently by all three SF radial tubes 72A–72C. Further, when disengaged, the section fasteners 76C allow (i) the third SF radial tube 72C to solely support the projection optical subassembly 26 and (ii) the second section 76B and the projection optical subassembly 26 to be retracted away from the first section 76A.

The section fasteners 76C can be implemented in a number of ways. For example, each of section fasteners 76C can be a latch, a bolt or other type of fastener that extends between the first section 76A and the second section 76B and/or between the first section 76A and the projection optical subassembly 26.

Preferably, the third SF radial tube 72C includes a second retractor 78 that selectively retracts the second section 76B and the projection optical subassembly 26 away from the first section 76A and the first and second SF radial tubes 72A, 72B. More specifically, the second retractor 78 selectively moves the second section 76B and the projection optical subassembly 26 between (i) an extended position (illustrated in FIG. 3A) in which the second section 76B and the projection optical subassembly 26 are positioned adjacent to the first section 76A and the first and second SF radial tubes 72A, 72B, and (ii) a retracted position (illustrated in FIG. 3B) in which the second section 76B and the projection optical subassembly 26 are positioned away from to the first section 76A and the first and second SF radial tubes 72A, 72B. Depending on the embodiment, the measurement subassembly 18 may be retracted along with the projection optical subassembly 26, or it may be disconnected from the projection optical subassembly 26 before the latter is moved. In the embodiment shown in the Figures, the measurement subassembly 18 is disconnected before the projection optical subassembly 26 is moved. As provided below, as a result of this design, the projection optical subassembly 26 can be easily pivoted.

The second retractor 78 can be implemented in a number of ways. For example, the second retractor 78 can include (i) a worm gear assembly that is turned manually or with a motor, (ii) a hydraulic motor, (iii) a pneumatic cylinder and/or (iv) a linear electric motor. The amount of movement of the second retractor 78 can vary according to the design requirements of the exposure apparatus 10. Preferably, the second retractor 78 moves the projection optical subassembly 26 linearly by at least approximately half the outer diameter of the projection optical subassembly 26. In the embodiment shown in FIGS. 3A–3C the second retractor 78 moves the projection optical subassembly 26 far enough to clear the first base frame 102 when it pivots.

Referring to FIGS. 1, 3A–3C, the pivot assembly 38 selectively pivots the projection optical subassembly 26 relative to the isolation base 32. In the embodiment illustrated in the Figures, the pivot assembly 38 includes a second pivot 80 that allows the second section 76B, the retractor 78, the projection optical subassembly 26, the third SF radial tube 72C and a portion of the third SF side tube 70C to be selectively pivoted and/or rotated outward away from the first section 76A. Stated another way, the second pivot 80 allows the second section 76B and the projection optical subassembly 26 to be moved between (i) a first position (illustrated in FIG. 3B) in which the second section 76B and the projection optical subassembly 26 are positioned radially away from the original location of the axis of the projection optical subassembly 26 and the first section 76A and (ii) a rotated position (illustrated in FIG. 3C) in which the second section 76B and the projection optical subassembly 26 are rotated away from the first section 76A and the first and second SF radial tubes 72A, 72B. In the rotated position, the projection optical subassembly 26 can be easily accessed for field service and adjustment. Further, in the rotated position, the projection optical subassembly 26 can be raised, lowered and/or positioned on a cart using the elevator assembly 36, without the use of an overhead crane.

The second pivot 80 can be implemented in a number of ways. For example, the second pivot 80 can include (i) a roller bearing assembly and (ii) an electric motor. The amount of movement of the second pivot 80 can vary according to the design requirements of the exposure apparatus 10. Preferably, the second first pivot 80 allows for the rotation of the third SF radial tube 72C at least approximately 90 degrees, and more preferably at least approximately 120 degrees, and even more preferably at least approximately 180 degrees relative to the third SF side tube 70C.

Referring to FIGS. 1, 3A–3C, the elevator assembly 36 selectively lifts the projection optical subassembly 26 relative to the isolation base 32. In the embodiment illustrated in the Figures, the elevator assembly 36 includes a first SF elevator 82A, a second SF elevator 82B, and a third SF elevator 82C that cooperate to selectively lift the second frame 42 and the projection optical subassembly 26 relative to the isolation base 32. In this embodiment, (i) the first SF elevator 82A is positioned between the isolation base 32 and the lower end 74B of the first SF side tube 70A and selectively lifts, lowers and/or moves the first SF side tube 70A relative to the isolation base 32, (ii) the second SF elevator 82B is positioned between the isolation base 32 and the lower end 74B of the second SF side tube 70B and selectively lifts, lowers and/or moves the second SF side tube 70B relative to the isolation base 32, and (iii) the third SF elevator 82C is positioned between the isolation base 32 and the lower end 74B of the third SF side tube 70C and selectively lifts, lowers and/or moves the third SF side tube 70C relative to the isolation base 32. Alternately, the SF elevators 82A–82C could be located in another location along the second frame 42.

As provided herein, the control system 20 can control the SF elevators 82A–82C to move concurrently or individually to suit the movement requirements of the second frame 42.

For example, the control system 20 can control the SF elevators 82A–82C to move concurrently to lift the projection optical subassembly 26 away from the second stage subassembly 16. In the lifted position, the projection optical subassembly 26 can be easily removed from the rest of the exposure apparatus 10. More specifically, after the second section 76B and the projection optical subassembly 26 are retracted away from the first section 76A by the second retractor 78 and pivoted with the second pivot 80, the third SF elevator 82C can be controlled by the control system 20 to individually raise or lower the projection optical subassembly 26 onto a cart without the use of an overhead crane.

Each of the SF elevators 82A–82C can be implemented in a number of ways. For example, each SF elevator 82A–82C can include (i) a worm gear assembly that is turned manually or with a motor, (ii) a hydraulic motor, (iii) a pneumatic cylinder, and/or (iv) a linear electric motor. The amount of movement of each SF elevator 82A–82C can vary according to the design requirements of the exposure apparatus 10. Each SF elevator 82A–82C must move at least enough for the bottom of the projection optical subassembly 26 and/or the measurement subassembly 18 (if it's attached) to clear the top of the second stage subassembly 16, and/or the second container 112 if it is present. Preferably each SF elevator 82A–82C moves at least approximately 3 inches, and more preferably at least approximately 6 inches, and even more preferably 9 inches. It should be noted that each of the frames 40, 42 illustrated in the Figures includes three sides. Alternately, for example, each frame 40, 42 can include more than three or less than three sides.

Referring back to FIG. 1, the frames 40, 42, 102, and 114 are secured to the isolation base 32. In this embodiment, the isolation base 32 is a flat structure. Preferably, the isolation base 32 is secured to a mounting base 84 with a plurality of spaced apart base isolators 86. The mounting base 84 can be the ground, a base, or floor or some other supporting structure. The base isolators 86 reduce the effect of vibration of the mounting base 84 causing vibration on the isolation base 32, the frames 40, 42, the measurement subassembly 18, and the optical subassemblies 24, 26. The design, number and location of the base isolators 86 can be varied. As provided herein, each base isolator 86 can include a pneumatic cylinder (not shown) that isolates vibration and an actuator (not shown) that isolates vibration and controls the position with at least two degrees of motion. Suitable base isolators 86 are sold by Integrated Dynamics Engineering, located in Woburn, Mass.

Importantly, both of the frames 40, 42 have built-in elevators 60A–60C, 82A–82C that allow the two optical subassemblies 24, 26 to be raised and lowered independently. This permits the removal of the optical subassemblies 24, 26 in the field without use of an overhead crane. Further, each of the optical subassemblies 24, 26 is supported by different frames 40, 42.

The first reaction frame 43 and the second reaction frame 44 support the non-moving components of the stage mover subassemblies of the exposure apparatus 10. The design of the reaction frames 43, 44 can be varied. In the embodiment illustrated in the figures, the reaction frames 43, 44 are secured to the mounting base 84 instead of the isolation base 32. With this design, reaction forces from the stage actuators are transferred directly to the mounting base 84, and the frames 40, 42, and the optical assemblies 24, 26 are isolated from significant reaction forces and associated vibration. The reaction frame 43 enters the first container 100 through flexible seals (not shown), which might be a number of ports sealed by o-rings, or by mechanical bellows. Alternatively, the reaction frame 43 may connect to the first stage mover assembly 98 by means of push-pull linear motion feedthroughs which seal to ports in first container 100. Such feedthroughs are manufactured by Huntington Mechanical Laboratories located in Mountain View, Calif. The reaction frame 44 extends through base apertures 115 in the isolation base 32 and enters the second container 112 through flexible seals (not shown), which might be a number of ports sealed by o-rings, or by mechanical bellows. Alternatively, push-pull linear motion feedthroughs could be used. It should be noted that the first container 100 and its associated supports 101A–101C, and second container 112 are optional components of the exposure apparatus 10.

The illumination system 22 includes an illumination source 90 and the illumination optical subassembly 24. The illumination source 90 emits a beam (irradiation) of light. The illumination source 90 can be the g-line (436 nm) or i-line (365 nm) radiation from a mercury discharge, a KrF excimer laser (248 nm), an ArF excimer laser (193 nm), or a $F_2$ laser (157 nm). The illumination source 90 could also be radiation in the extreme ultraviolet (EUV) region of the spectrum. Alternately, the illumination source 90 can also use charged particle beams such as an ion or electron beam. For instance, in the case where an electron beam is used, thermionic emission type lanthanum hexaboride ($LaB_6$) or tantalum (Ta) can be used as a cathode material. Furthermore, in the case where an electron beam is used, the structure could be such that either a mask is used or a pattern can be directly formed on a substrate without the use of a mask. For the shorter wavelength radiation sources, and for the charged particle beams, a controlled environment surrounding the beam is required, and first container 100 and second container 112 must be present and hermetically sealed to the optical subassemblies.

The illumination optical subassembly 24 guides the irradiation from the illumination source 90 to above the first stage subassembly 14. In the embodiment illustrated in the Figures, the illumination optical subassembly 24 is secured with the first frame 40 to the isolation base 32.

The first stage subassembly 14 holds and positions the reticle 28 relative to the projection optical assembly 26 and the substrate 30. The design of the first stage subassembly 14 and the components of the first stage subassembly 14 can be varied to suit the design requirements of the exposure apparatus 10. In the embodiment illustrated in FIG. 1, the first stage subassembly 14 includes a first stage base 94 (illustrated in phantom as a block), a first stage 96 (illustrated in phantom as a block), a first stage mover assembly 98 (illustrated in phantom as a pair of blocks) and a first container 100.

The first stage base 94 guides and supports the first stage 96. Typically, the first stage base 94 is a generally flat plate that includes an opening that allows the energy beam (not shown) to pass from the reticle 28 to the projection optical assembly 26. In the embodiment illustrated in FIG. 1, a first base frame 102 secures the first stage base 94 to the isolation base 32. Additionally, because the first stage base 94 supports the first stage 96, the first base frame 102 also supports the first stage 96 above the isolation base 32.

Preferably, the first stage base 94 is secured to the first base frame 102 with a plurality of first base actuators 104. With this design, the position of the first stage base 94 and the first stage 96 relative to the projection optical subassembly 26 can be adjusted with the first base actuators 104 along the Z axis, about the Y axis and about the X axis. The first base actuators 104 include sufficient range that they can provide an elevator function and raise the first stage base 94 by an amount sufficient for removal of the first stage subassembly 14. They can also raise the first stage base 94 sufficiently that the projection optics subassembly 26 can be removed.

The first stage 96 retains the reticle 28. A fluid bearing may support the first stage 96 above the first stage base 94 and allow for motion of the first stage 96 along the X axis, along the Y axis and about the Z axis relative to the first stage base 94. As provided herein, for situations requiring a vacuum environment surrounding the irradiation beam, a vacuum compatible type fluid bearing, such as described in U.S. Pat. No. 6,126,169 supports the first stage 96 above the first stage base 94. Alternately, the first stage 96 can be supported spaced apart from the first stage base 94 by other ways. For example, a magnetic type bearing or roller type bearing could be utilized that allows for motion of the first stage 96 relative to the first stage base 94.

The first stage mover assembly 98 moves and positions the first stage 96 relative to the first stage base 94 and the rest of the exposure apparatus 10. The design of the first stage mover assembly 98 can be varied. For example, the first stage mover assembly 98 can include one or more rotary motors, voice coil motors, linear motors, electromagnetic actuators, and/or some other type of force actuators. Preferably, the first stage mover assembly 98 moves and positions the first stage 96 along the X axis, along the Y axis and about the Z axis under the control of the control system 20. Alternately, for example, the first stage mover assembly 98 could be designed to move the first stage 96 relative to the first stage base 94 along the X axis, along the Y axis, along the Z axis, about the X axis, about the Y axis and/or about the Z axis.

Preferably, the non-moving components of the first stage mover assembly 98 are coupled and secured to the first reaction frame 43. With this design, the reaction forces and associated vibration from the first stage mover assembly 98 are transferred through the first reaction frame 43 directly to the mounting base 84 without influencing the position of the optical subassemblies 24, 26 and the measurement subassembly 18.

The first container 100 encloses the reticle 28 and is used to provide a controlled environment around the reticle 28. The controlled environment, for example, can be a vacuum, or an inert gas. The first container 100 can be sealed to the illumination optical assembly 24 and the projection optical assembly 26 with flexible seals, such as mechanical bellows or o-rings (not shown). In this embodiment, the first container 100 is generally box shaped and is supported from FF radial tubes 48A–48C by supports 101A–101C respectively (support 101B is not shown). The first base actuators 104 enter the first container 100 through flexible seals such as mechanical bellows or o-rings. Alternatively, the first base actuators 104 may connect to the first stage base 94 by means of push-pull linear motion feedthroughs which seal to ports in first container 100. Such feedthroughs are manufactured by Huntington Mechanical Laboratories located in Mountain View, Calif. It should be noted that the first container 100 and its associated supports 101A–101C are optional components of the exposure apparatus 10.

The projection optical subassembly 26 projects and/or focuses the irradiation passing through reticle 28 to the substrate 30. Depending upon the design of the exposure apparatus 10, the projection optical subassembly 26 can magnify or reduce the image of the pattern created at the reticle. Alternately, the projection optical subassembly 26 can be a 1×magnification system.

With respect to the projection optical subassembly 26, when deep ultraviolet radiation such as from an excimer laser is used, glass materials such as quartz and fluorite that transmit far ultra-violet rays are preferably to be used. When extreme ultraviolet radiation is used, the optical path should be enclosed and provided with an inert gas or a vacuum. When an electron beam is used, electron optics should preferably consist of electron lenses and deflectors. The optical path for the electron beams should be in a vacuum.

The second stage subassembly 16 holds and positions the substrate 30 with respect to the projected image of the illuminated portions of the reticle 28. The design of the second stage subassembly 16 and the components of the second stage subassembly 16 can be varied to suit the design requirements of the exposure apparatus 10. In the embodiment illustrated in FIG. 1, the second stage subassembly 16 includes a second stage base 108 (illustrated in phantom as a block), a second stage 109 (illustrated in phantom as a block), a second stage mover assembly 110 (illustrated in phantom as a pair of blocks) and a second container 112.

The second stage base 108 guides and supports the second stage 109. Typically, the second stage base 108 is a generally flat plate. In the embodiment illustrated in FIG. 1, a second base frame 114 secures the second stage base 108 to the isolation base 32. Additionally, because the second stage base 108 supports the second stage 109, the second base frame 114 also supports the second stage 109 above the isolation base 32. The second base frame 114 enters the second container 112 through flexible seals such as mechanical bellows or o-rings. Alternatively, the second base frame 114 may connect to the second stage base 108 by means of push-pull linear motion feedthroughs which seal to ports in second container 112. Such feedthroughs are manufactured by Huntington Mechanical Laboratories located in Mountain View, Calif.

The second stage 109 retains the substrate 30. Typically, a vacuum compatible type fluid bearing supports the second stage 109 above the second stage base 108 and allows for motion of the second stage 109 along the X axis, the Y axis and about the Z axis relative to the second stage base 108. Alternately, the second stage 109 can be supported spaced apart from the second stage base 108 by other ways. For example, a roller type bearing could be utilized that allows for motion of the second stage 109 relative to the second stage base 108.

The second stage mover assembly 110 moves and positions the second stage 109 relative to the second stage base 108 and the rest of the exposure apparatus 10. The design of the second stage mover assembly 110 can be varied. For example, the second stage mover assembly 110 can include one or more rotary motors, voice coil motors, linear motors, electromagnetic actuators, and/or some other type of force actuators. Preferably, the second stage mover assembly 110 moves and positions the second stage 109 along the X axis, along the Y axis and about the Z axis under the control of the control system 20. Alternately, for example, the second stage mover assembly 110 could be designed to move the second stage 109 relative to the second stage base 109 along the X axis, along the Y axis, along the Z axis, about the X axis, about the Y axis and/or about the Z axis.

Preferably, the second stage base 108 is secured to the second base frame 114 with a plurality of second base actuators 116. With this design, the position of the second stage base 108 and the second stage 109 relative to the projection optical subassembly 26 can be adjusted with the second base actuators 116 along the Z axis, about the Y axis and about the X axis.

The second stage 109 retains the substrate 30. A fluid bearing may support the second stage 109 above the second stage base 108 and allow for motion of the second stage 109 along the X axis, along the Y axis and about the Z axis relative to the second stage base 108. As provided herein, for situations requiring a vacuum environment surrounding the irradiation beam, a vacuum compatible type fluid bearing, such as described in U.S. Pat. No. 6,126,169 supports the second stage 109 above the second stage base 108. Alternately, the second stage 109 can be supported spaced apart from the second stage base 108 by other ways. For example, a magnetic type bearing or roller type bearing could be utilized that allows for motion of the second stage 109 relative to the second stage base 108.

The second container 112 encloses the substrate 30 and is used to provide a controlled environment around the substrate 30. Typically, the controlled environment is a vacuum, or an inert gas. The second container 112 can be sealed to the projection optical assembly 26 with a flexible seal, such as a mechanical bellows (not shown). The second container 112 is generally box shaped, and is secured to and supported by the isolation base 32. It should be noted that the second container 112 is an optional component of the exposure apparatus 10.

The measurement subassembly 18 monitors the position of the first stage 96, and the second stage 109 relative to the projection optical subassembly 26 or some other reference location. With this information, the first stage mover assembly 98 can be used to precisely position the first stage 96 and the second stage mover assembly 110 can be used to precisely position of the second stage 109.

The design of the measurement subassembly 18 can be varied. For example, the measurement system 18 can utilize one or more laser interferometers, encoders, and/or other measuring devices to monitor the position of the stages 96, 109 relative to the projection optical subassembly 26. In the embodiment illustrated in FIG. 1, the measurement system 18 includes (i) a first bracket 118 that secures a first laser interferometer system 120 to the projection optical subassembly 26 near the first stage subassembly 14 and (ii) a second bracket 122 that secures a second laser interferometer system 124 to the projection optical subassembly 26 near the second stage subassembly 16. The first interferometer system 120 monitors the position of the first stage 96 relative to the projection optical subassembly 26, and the second interferometer system 124 monitors the position of the second stage 109 relative to the projection optical subassembly 26. Importantly, with this design the measurement subassembly 18 is mounted directly to projection optical subassembly 26. As a result thereof, the measurement subassembly 18 is isolated from vibrations generated by reaction forces from the stage mover assemblies.

The control system 20 controls the first stage mover assembly 98 to precisely position the first stage 96, and the second stage mover assembly 110 to precisely position the second stage 109. Additionally, in the embodiment illustrated in the Figures, the control system 20 directs and controls the signal to the elevator assembly 36 to control the movement of the frames 40, 42.

Figure 4A:
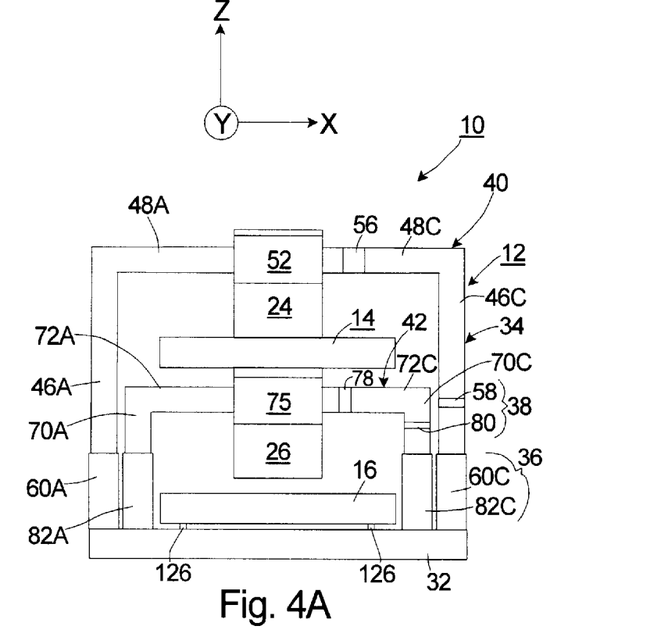
FIG. 4A is a simplified front plan illustration of the exposure apparatus with an illumination optical subassembly, a first stage subassembly, and a projection optical subassembly lifted.
Figure 4B:
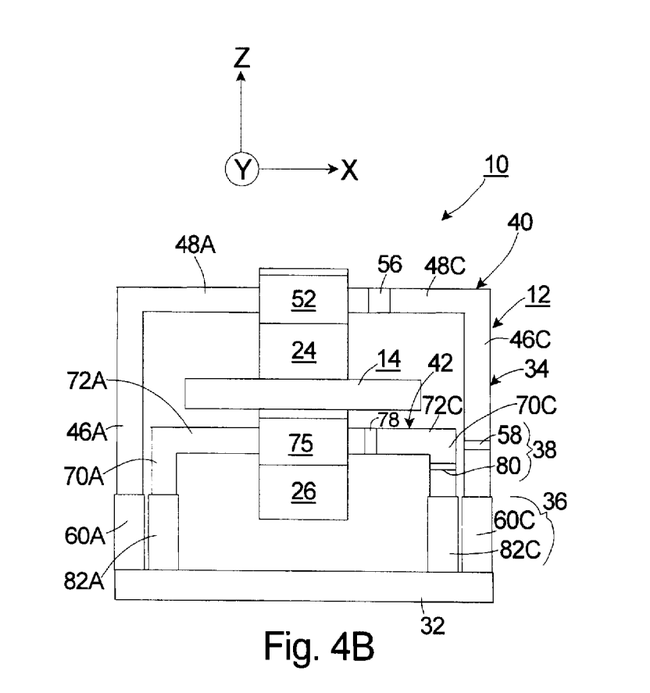
FIG. 4B is a simplified front plan illustration of the exposure apparatus after a second stage subassembly was removed and the other subassemblies are lifted.
Figure 4C:
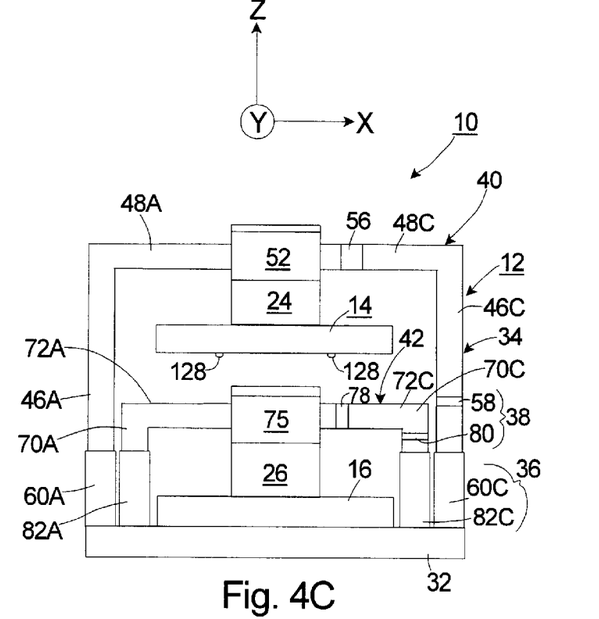
FIG. 4C is a simplified front plan illustration of the exposure apparatus with the illumination optical subassembly and the first stage subassembly lifted.

The disassembly of the exposure apparatus 10 can probably be best understood with initial reference to FIGS. 4A–4C. In particular, FIG. 4A illustrates that the elevator assembly 36 can be used to lift the first frame 40, the illumination optical subassembly 24, part of the first stage subassembly 14 (using the first base actuators 104), the second frame 42 and the projection optical subassembly 26 relative to the isolation base 32 and the second stage subassembly 16. Prior to the elevation, the first stage subassembly 14 is disconnected from the reaction frame 43, and other attachment points, such as hoses and cables. In this configuration the second stage subassembly 16 can be raised using several jacks (not shown) positioned beneath its bottom, in recesses in the isolation base 32, or located on the mounting base 84 beneath openings in the isolation base 32 providing access to the bottom of the second stage subassembly 16, and a pair of rails 126 can be then positioned under the second stage subassembly 16. Alternatively, the second stage subassembly 16 could be attached to the SF radial tubes 72A–72C by means not shown and lifted by the SF elevators 82A–82C. The rails 126 can be used to easily remove the second stage subassembly 16. Prior to the elevation, the second stage subassembly 16 is disconnected from the reaction frame 44, the second base frame 114, and other attachment points, such as hoses and cables. FIG. 4B illustrates the exposure apparatus 10 after removal of the second stage subassembly 16.

Alternately, if the second container 112 is present, it may be more convenient to remove both the second container 112 and the second stage subassembly 16 together, using a method similar to the above.

Figure 4D:
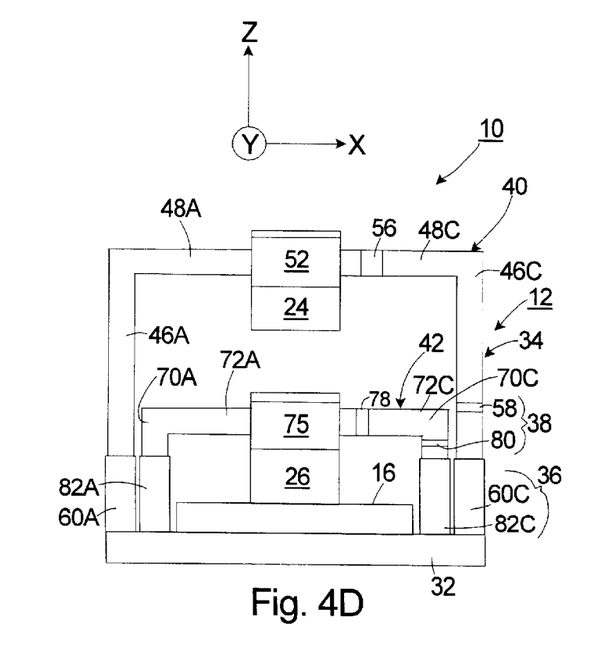
FIG. 4D is a front plan illustration of the exposure apparatus with the illumination optical subassembly lifted and the first stage subassembly removed.

FIG. 4C illustrates that the elevator assembly 36 can be used to lift the first frame 40, the illumination optical subassembly 24, and, with the use of first base actuators 104, part of the first stage subassembly 14 relative to the second frame 42, the projection optical subassembly 26, the isolation base 32 and the second stage subassembly 16. In this configuration a pair of rails 128 can be positioned under the first stage subassembly 14. The rails 128 can be used to easily remove the first stage subassembly 14. Prior to the elevation and removal, the first stage subassembly 14 is disconnected from the reaction frame 43, the first base frame 102, and other attachment points, such as hoses and cables. FIG. 4D illustrates the exposure apparatus after removal of the first stage subassembly 14. In this configuration, each of the optical subassemblies 24, 26 can be independently retracted, rotated, lifted and/or lowered.

Alternately, if the first container 100 is present, it may be more convenient to remove both the first container 100 and the first stage subassembly 14 together, using a method similar to the above.

Importantly, both of the frames 40, 42 have built-in elevators that allow the two optical subassemblies 24, 26 to be raised and lowered independently. This feature, combined with the first base actuators 104, permits the removal of the optical subassemblies 24, 26 in the field without use of an overhead crane. Additionally, the first stage subassembly 14 and the second stage subassembly 16 can be removed as well. Further, each of the optical subassemblies 24, 26 is supported by different frames 40, 42. If the first container 100 is present, it must first be supported on rails 128, and supports 101A–101C removed, before illumination optical subassembly 24 is removed.

While the particular exposure apparatus 10 and the support assembly 12 as shown and disclosed herein are fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A support assembly that supports a subassembly of an exposure apparatus relative to an: isolation base, the support assembly comprising:

a frame assembly that supports the subassembly, the frame assembly including a first frame having three spaced apart side tubes and a second frame; and an elevator assembly that selectively lifts a portion of the frame assembly and the subassembly relative to the isolation base, the elevator assembly including a first elevator that lifts the first frame relative to the second frame and the isolation base and a second elevator that lifts the second frame relative to the first frame and the isolation base, the elevator assembly being adapted to lift the side tubes concurrently and independently.

2. The support assembly of claim 1 wherein one of the three side tubes of the first frame includes a retractor for selectively retracting a portion of the first frame and the subassembly away from the other two side tubes of the first frame.

3. The support assembly of claim 1 wherein the second frame includes three spaced apart side tubes and the elevator assembly lifts the side tubes of the second frame concurrently and independently.

4. The support assembly of claim 3 wherein one of the three side tubes of the second frame includes a retractor for selectively retracting a portion of the second frame and the subassembly away from the other two side tubes of the second frame.

5. The support assembly of claim 1 wherein the frame assembly includes a pivot assembly that allows a portion of the frame assembly and the subassembly to pivot relative to the isolation base.

6. The support assembly of claim 1 further comprising a first pivot that allows a portion of the first frame to pivot relative to the second frame and the isolation base.

7. The support assembly of claim 6 further comprising a second pivot that allows a portion of the second frame to pivot relative to the first frame and the isolation base.

8. The support assembly of claim 1 wherein the elevator assembly lifts the subassembly at least approximately three inches.

9. The support assembly of claim 1 wherein the elevator assembly lifts the subassembly at least approximately six inches.

10. An exposure apparatus including the support assembly of claim 1, an illumination optical subassembly and a projection optical subassembly.

11. The exposure apparatus of claim 10 wherein the first frame secures the illumination optical subassembly to the isolation base and the second frame secures the projection optical subassembly to the isolation base.

12. The exposure apparatus of claim 11 further comprising a stage mover assembly and a reaction frame that couples the stage mover assembly to a mounting base.

13. The exposure apparatus of claim 11 wherein the first elevator lifts the first frame and the illumination optical subassembly relative to the second frame and the isolation base, and the second elevator lifts the second frame and the projection optical subassembly relative to: the first frame and the isolation base.

14. The exposure apparatus of claim 11 further comprising (i) a first pivot that allows a portion of the first frame and the illumination optical subassembly to pivot relative to the second frame and the isolation base and (ii) a second pivot that allows a portion of the second frame and the projection optical subassembly to pivot relative to the first frame and the isolation base.

15. A device manufactured with the exposure apparatus according to claim 10.

16. A wafer on which an image has been formed by the exposure apparatus of claim 10.

17. An exposure apparatus comprising:

an illumination optical subassembly;

a projection optical subassembly;

a frame assembly including a first frame that secures the illumination optical subassembly to an isolation base and a second frame that secures the projection optical subassembly to the isolation base; and an elevator assembly that selectively lifts a portion of the frame assembly and at least one of the subassemblies relative to the isolation base.

18. The exposure apparatus of claim 17 wherein the elevator assembly includes (i) a first elevator that lifts the first frame and the illumination optical subassembly relative to the second frame and the isolation base and (ii) a second elevator that lifts the second frame and the projection optical subassembly relative to the first frame and the isolation base.

19. The exposure apparatus of claim 17 comprising (i) a first pivot that allows a portion of the first frame and the illumination optical subassembly to pivot relative to the second frame and the isolation base and (ii) a second pivot that allows a portion of the second frame and the projection optical subassembly to pivot relative to the first frame and the isolation base.

20. The exposure apparatus of claim 17 wherein (i) the first frame includes three spaced apart side tubes and the elevator assembly is adapted to lift the side tubes of the first frame concurrently and independently and (ii) the second frame includes three spaced apart side tubes and the elevator assembly is adapted to lift the side tubes of the second frame concurrently and independently.

21. The exposure apparatus of claim 20 wherein (i) one of the three side tubes of the first frame includes a retractor for selectively retracting a portion of the first frame and the illumination optical subassembly away from the other two side tubes of the first frame and (ii) one of the three side tubes of the second frame includes a retractor for selectively retracting a portion of the second frame and the projection optical subassembly away from the other two side tubes of the second frame.

22. The exposure apparatus of claim 17 further comprising a stage mover and a reaction frame that couples the stage mover assembly to a mounting base.

23. A device manufactured with the exposure apparatus according to claim 17.

24. A wafer on which an image has been formed by the exposure apparatus of claim 17.

25. A support assembly that supports a subassembly of an exposure apparatus relative to an isolation base, the support assembly comprising:

a frame assembly that supports the subassembly, the frame assembly including a first frame having three spaced apart side tubes and a second frame having three spaced apart side tubes;

a pivot assembly that allows a portion of the subassembly to pivot relative to the isolation base; and an elevator assembly that lifts the first frame relative to the second frame and the isolation base, and lifts the second frame relative to the first frame and the isolation base, wherein the elevator assembly is adapted to lift the side tubes of the first frame concurrently and independently and is adapted to lift the side tubes of the second frame concurrently and independently.

26. The support assembly of claim 25 wherein the pivot assembly allows a portion of the frame assembly and the subassembly to pivot relative to the isolation base at least approximately ninety degrees.

27. The support assembly of claim 25 wherein the pivot assembly allows a portion of the frame assembly and the subassembly to pivot relative to the isolation base at least approximately one hundred twenty degrees.

28. The support assembly of claim 25 wherein the pivot assembly includes (i) a first pivot that allows a portion of the first frame to pivot relative to the second frame and the isolation base and (ii) a second pivot that allows a portion of the second frame to pivot relative to the first frame and the isolation base.

29. An exposure apparatus including the support assembly of claim 25 an illumination optical subassembly and a projection optical subassembly.

30. The exposure apparatus of claim 29 wherein the first frame secures the illumination optical subassembly to the isolation base and the second frame secures the projection optical subassembly to the isolation base.

31. The exposure apparatus of claim 30 wherein the elevator assembly lifts the first frame and the illumination optical subassembly relative to the second frame and the isolation base, and the elevator assembly lifts the second frame and the projection optical subassembly relative to the first frame and the isolation base.

32. The exposure apparatus of claim 30 wherein (i) one of the three side tubes of the first frame includes a retractor for selectively retracting a portion of the first frame and the illumination optical subassembly away from the other two side tubes of the first frame and (ii) one of the three side tubes of the second frame includes a retractor for selectively retracting a portion of the second frame and the projection optical subassembly away from the other two side tubes of the second frame.

33. The exposure apparatus of claim 30 wherein the pivot assembly includes (i) a first pivot that allows a portion of the first frame and the illumination optical subassembly to pivot relative to the second frame and the isolation base and (ii) a second pivot that allows a portion of the second frame and the projection optical subassembly to pivot relative to the first frame and the isolation base.

34. The exposure apparatus of claim 30 further comprising a stage mover assembly and a reaction frame that couples the stage mover assembly to a mounting base.

35. A device manufactured with the exposure apparatus according to claim 29.

36. A wafer on which an image has been formed by the exposure apparatus of claim 29.

37. An exposure apparatus comprising:
an illumination optical subassembly;
a projection optical subassembly;
a frame assembly, including a first frame that secures the illumination optical subassembly to an isolation base and a second frame that secures the projection optical subassembly to the isolation base; and
a pivot assembly that allows a portion of at least one of the subassemblies to pivot relative to the isolation base.

38. The exposure apparatus of claim 37 further comprising an elevator assembly that (i) lifts the first frame and the illumination optical subassembly relative to the second frame and the isolation base and (ii) lifts the second frame and the projection optical subassembly relative to the first frame and the isolation base.

39. The exposure apparatus of claim 38 wherein (i) the first frame includes three spaced apart side tubes and the elevator assembly is adapted to lift the side tubes of the first frame concurrently and independently and (ii) the second frame includes three spaced apart side tubes and the elevator assembly is adapted to lift the side tubes of the second frame concurrently and independently.

40. The exposure apparatus of claim 39 wherein (i) one of the three side tubes of the first frame includes a retractor for selectively retracting a portion of the first frame and the illumination optical subassembly away from the other two side tubes of the first frame and (ii) one of the three side tubes of the second frame includes a retractor for selectively retracting a portion of the second frame and the projection optical subassembly away from the other two side tubes of the second frame.

41. The exposure apparatus of claim 37 wherein the pivot assembly includes (i) a first pivot that allows a portion of the first frame and the illumination optical subassembly to pivot relative to the second frame and the isolation base and (ii) a second pivot that allows a portion of the second frame and the projection optical subassembly to pivot relative to the first frame and the isolation base.

42. The exposure apparatus of claim 37 further comprising a stage mover assembly and a reaction frame that couples the stage mover assembly to a mounting base.

43. A device manufactured with the exposure apparatus according to claim 37.

44. A wafer on which an image has been formed by the exposure apparatus of claim 37.

45. A method for making an exposure apparatus that forms an image on a wafer, the method comprising the steps of:
providing an illumination optical subassembly;
providing a projection optical subassembly;
supporting at least one of the subassemblies above an isolation base with a frame assembly; and
selectively pivoting a portion of the frame assembly and at least one of the subassemblies relative to the isolation base with a pivot assembly.

46. The method of claim 45 wherein the step of supporting includes the steps of providing a first frame that supports the illumination optical subassembly and providing a second frame that supports the projection optical subassembly, and wherein the step of selectively pivoting includes the steps of pivoting the first frame and the illumination optical subassembly relative to the second frame and pivoting the second frame and the projection optical subassembly relative to the first frame.

47. The method of claim 46 further comprising the step of lifting a portion of the first frame and the illumination optical subassembly relative to the second frame, and the step of lifting a portion of the second frame and the projection optical subassembly relative to the first frame.

48. A method of making a wafer utilizing the exposure apparatus made by the method of claim 45.

49. A method of making a device including at least the exposure process, wherein the exposure process utilizes the exposure apparatus made by the method of claim 45.

50. A method for making an exposure apparatus that forms an image on a wafer, the method comprising the steps of:
providing an illumination optical subassembly;
providing a projection optical subassembly;
supporting at least one of the subassemblies with a frame assembly; and
selectively lifting a portion of the frame assembly and at least one of the subassemblies relative to an isolation base with an elevator assembly.

51. The method of claim 50 wherein the step of supporting includes the steps of providing a first frame that supports the illumination optical subassembly and providing a second frame that supports the projection optical subassembly, and wherein the step of selectively lifting includes the steps of lifting the first frame and the illumination optical subassembly relative to the second frame and lifting the second frame and the projection optical subassembly relative to the first frame.

52. The method of claim 51 further comprising the step of pivoting a portion of the first frame and the illumination optical subassembly relative to the second frame, and the step of pivoting a portion of the second frame and the projection optical subassembly relative to the first frame.

53. A method of making a wafer utilizing the exposure apparatus made by the method of claim 50.

54. A method of making a device including at least the exposure process, wherein the exposure process utilizes the exposure apparatus made by the method of claim 50.

55. An exposure apparatus that forms an image on a wafer, the exposure apparatus comprising:
   a projection optical subassembly;
   a frame assembly that supports the projection optical subassembly;
   a wafer stage assembly that retains the wafer; and
   an elevator assembly that selectively lifts a portion of the frame assembly and the projection optical subassembly relative to an isolation base.

56. The exposure apparatus of claim 55 wherein the frame assembly includes a pivot assembly that allows a portion of the frame assembly and the projection optical subassembly to pivot relative to the isolation base.

57. The exposure apparatus of claim 55 wherein the frame assembly includes a first frame and a second frame.

58. The exposure apparatus of claim 57 wherein the elevator assembly includes a first elevator that lifts the first frame relative to the second frame and the isolation base.

59. The exposure apparatus of claim 58 wherein the elevator assembly further includes a second elevator that lifts the second frame relative to the first frame and the isolation base.

60. The exposure apparatus of claim 59 further comprising a first pivot that allows a portion of the first frame to pivot relative to the second frame and the isolation base.

61. The exposure apparatus of claim 60 further comprising a second pivot that allows a portion of the second frame to pivot relative to the first frame and the isolation base.

62. The exposure apparatus of claim 57 wherein the first frame includes three spaced apart side tubes and the elevator assembly lifts the side tubes of the first frame concurrently and independently.

63. The exposure apparatus of claim 62 wherein the second frame includes three spaced apart side tubes and the elevator assembly lifts the side tubes of the second frame concurrently and independently.

64. The exposure apparatus of claim 55 wherein the elevator assembly lifts the projection optical subassembly at least approximately three inches.

65. The exposure apparatus of claim 55 wherein the elevator assembly lifts the projection optical subassembly at least approximately six inches.

66. The exposure apparatus of claim 55 further comprising an illumination optical subassembly that is supported by the frame assembly, wherein the frame assembly includes a first frame having three spaced apart side tubes and a second frame having three spaced apart side tubes, wherein one of the three side tubes of the first frame includes a retractor for selectively retracting a portion of the first frame and the illumination optical subassembly away from the other two side tubes of the first frame, and. wherein one of the three side tubes of the second frame includes a retractor for selectively retracting a portion of the second frame and the projection optical subassembly away from the other two side tubes of the second frame.

67. The exposure apparatus of claim 55 further comprising a stage mover assembly and a reaction frame that couples the stage mover assembly to a mounting base.

68. A device manufactured with the exposure apparatus according to claim 55.

69. A wafer on which an image has been formed by the exposure apparatus of claim 55.

70. An exposure apparatus that forms an image on a wafer, the exposure apparatus comprising:
   a projection optical subassembly;
   a frame assembly that supports the projection optical subassembly;
   a wafer stage assembly that retains the wafer; and
   a pivot assembly that allows a portion of the projection optical subassembly to pivot relative to an isolation base.

71. The exposure apparatus of claim 70 wherein the pivot assembly allows a portion of the frame assembly and the projection optical subassembly to pivot relative to the isolation base at least approximately ninety degrees.

72. The exposure apparatus of claim 70 wherein the pivot assembly allows a portion of the frame assembly and the projection optical subassembly to pivot relative to the isolation base at least approximately one hundred twenty degrees.

73. The exposure apparatus of claim 70 wherein the frame assembly includes a first frame and a second frame.

74. The exposure apparatus of claim 73 wherein the pivot assembly includes (i) a first pivot that allows a portion of the first frame to pivot relative to the second frame and the isolation base and (ii) a second pivot that allows a portion of the second frame to pivot relative to the first frame and the isolation base.

75. The exposure apparatus of claim 73 further comprising an elevator assembly that lifts the first frame relative to the second frame and the isolation base, and lifts the second frame relative to the first frame and the isolation base.

76. The exposure apparatus of claim 75 wherein (i) the first frame includes three spaced apart side tubes and the elevator assembly lifts the side tubes of the first frame concurrently and independently and (ii) the second frame includes three spaced apart side tubes and the elevator assembly lifts the side tubes of the second frame concurrently and independently.

77. The exposure apparatus of claim 70 further comprising an illumination optical subassembly that is supported by the frame assembly, wherein the frame assembly includes a first frame having three spaced apart side tubes and a second frame having three spaced apart side tubes, wherein one of the three side tubes of the first frame includes a retractor for selectively retracting a portion of the first frame and the illumination optical subassembly away from the other two side tubes of the first frame, and wherein one of the three side tubes of the second frame includes a retractor for selectively retracting a portion of the second frame and the projection optical subassembly away from the other two side tubes of the second frame.

78. The exposure apparatus of claim 70 further comprising a stage mover assembly and a reaction frame that couples the stage mover assembly to a mounting base.

79. A device manufactured with the exposure apparatus according to claim 70.

80. A wafer on which an image has been formed by the exposure apparatus of claim 70.

81. A method for making an exposure apparatus that forms an image on a wafer, the method comprising the steps of:

providing a projection optical subassembly;

supporting the projection optical subassembly with a frame assembly;

retaining the wafer with a wafer stage assembly; and selectively lifting a portion of the frame assembly and the projection optical subassembly relative to an isolation base with an elevator assembly.

82. The method of claim 81 further comprising the step of pivoting a portion of the frame assembly and the projection optical subassembly relative to the isolation base with a pivot assembly.

83. The method of claim 81 wherein the step of supporting the projection optical subassembly includes the step of providing a first frame and a second frame, and wherein the step of selectively lifting includes the steps of lifting the first frame relative to the second frame and lifting the second frame relative to the first frame.

84. The method of claim 83 further comprising the steps of pivoting a portion of the first frame relative to the second frame and pivoting the second frame relative to the first frame.

85. The method of claim 81 further comprising the steps of providing an illumination optical subassembly and supporting the illumination optical subassembly with the frame assembly.

86. A method of making a wafer utilizing the exposure apparatus made by the method of claim 81.

87. A method of making a device including at least the exposure process, wherein the exposure process utilizes the exposure apparatus made by the method of claim 81.

88. A support assembly that supports a subassembly of an exposure apparatus relative to an isolation base, the support assembly comprising:

a frame assembly that supports the subassembly, the frame assembly including a first frame having a first side tube and a second side tube spaced apart from the first side tube, wherein the first side tube includes a first retractor for selectively retracting a portion of the frame assembly and the subassembly away from the second side tube; and an elevator assembly that selectively lifts a portion of the frame assembly and the subassembly relative to the isolation base.

89. The support assembly of claim 88 wherein the frame assembly includes a second frame.

90. The support assembly of claim 89 wherein the second frame includes a third side tube and a fourth side tube.

91. The support assembly of claim 89 wherein the elevator assembly includes a first elevator that lifts the first frame relative to the second frame and the isolation base, and a second elevator that lifts the second frame relative to the first frame and the isolation base.

92. The support assembly of claim 89 further comprising a pivot assembly including a first pivot that allows a portion of the first frame to pivot relative to the second frame and the isolation base, and a second pivot that allows a portion of the second frame to pivot relative to the first frame and the isolation base.

93. An exposure apparatus including the support assembly of claim 89, an illumination optical subassembly and a projection optical subassembly.

94. The exposure apparatus of claim 93 wherein the frame assembly further comprises a second frame, the first frame securing the illumination optical subassembly to the isolation base and the second frame securing the projection optical subassembly to the isolation base.

95. The exposure apparatus of claim 94 wherein the second frame includes a third side tube and a fourth side tube spaced apart from the third side tube wherein the first retractor selectively retracts a portion of the first frame and the illumination optical subassembly away from the second side tube, and wherein the third side tube includes a second retractor for selectively retracting a portion of the second frame and the projection optical subassembly away from the fourth side tube.

96. The exposure apparatus of claim 94 further comprising an elevator assembly including (i) a first elevator that lifts the first frame and the illumination optical subassembly relative to the second frame and the isolation base and (ii) a second elevator that lifts the second frame and the projection optical subassembly relative to the first frame and the isolation base.

97. The exposure apparatus of claim 94 further comprising a pivot assembly including (i) a first pivot that allows a portion of the first frame and the illumination optical subassembly to pivot relative to the second frame and the isolation base and (ii) a second pivot that allows a portion of the second frame and the projection optical subassembly to pivot relative to the first frame and the isolation base.

98. The exposure apparatus of claim 94 further comprising a stage mover assembly and a reaction frame that couples the stage mover assembly to a mounting base.

99. A device manufactured with the exposure apparatus according to claim 93.

100. A wafer on which an image has been formed by the exposure apparatus of claim 93.

* * * * *